United States Patent
Nakayama

(10) Patent No.: US 6,737,709 B1
(45) Date of Patent: May 18, 2004

(54) SEMICONDUCTOR DEVICE

(75) Inventor: Hajime Nakayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/210,540

(22) Filed: Dec. 14, 1998

(30) Foreign Application Priority Data

Dec. 15, 1997 (JP) .......................................... PO9-345363

(51) Int. Cl.$^7$ ........................ H01L 29/76; H01L 21/336; H01L 21/8238
(52) U.S. Cl. ........................ 257/369; 257/370; 257/371; 257/375; 257/392; 438/199; 438/217; 438/218; 438/284; 438/286
(58) Field of Search ................................ 257/157, 199, 257/218, 375, 204, 206, 214, 338, 350, 351, 357, 69, 421, 367–371, 392, 401, 195; 438/199, 218, 284, 286, 129, 217

(56) References Cited

U.S. PATENT DOCUMENTS 5,856,215 A * 1/1999 Jung ........................... 438/199
6,114,741 A * 9/2000 Joyner et al. ................ 257/506

* cited by examiner

Primary Examiner—Kang Donghee
(74) Attorney, Agent, or Firm—Sonnenschein, Nath & Rosenthal LLP

(57) ABSTRACT

A semiconductor device suppressing the lateral diffusion of impurities doped in a PMOS and NMOS and shortening the distance between the PMOS and NMOS to reduce the size of the semiconductor device, including PMOS and NMOS formation regions isolated by an element isolation region; a p-type gate electrode arranged on the PMOS formation region; an n-type gate electrode arranged on the NMOS formation region; and first and second impurity storage regions arranged in a direction different from that of the arrangement of the p-type and n-type gate electrodes. An end of the first impurity storage region is connected to the p-type gate electrode, an end of the second impurity storage region is connected to the n-type gate electrode, and the other ends of the first and second impurity storage regions are electrically connected.

9 Claims, 3 Drawing Sheets

SEMICONDUCTOR DEVICE

BACKGROUND OF THE INVENTION

1. Field of the Invention

The present invention relates to a semiconductor device, more specifically a complementary metal oxide semiconductor (CMOS) device having a p-channel MOS (hereafter called a PMOS) field effect transistor (FET) using holes as carriers and an n-channel MOS (hereafter called an NMOS) FET using electrons as carriers on the same chip.

2. Description of the Related Art

At the present time, most CMOS integrated circuits use a so-called two-layer "polyclde" structure of a metal sillicide layer and polycrystalline silicon layer for their gate electrodes so as to decrease the resistance of their gate electrodes.

In CMOS's having an NMOSFET and PMOSFET on the same substrate, it is generally known to use a so-called "dual gate" structure for the gate electrodes from the viewpoints of suppressing the, short channel effect, controlling the threshold voltage, etc.

A CMOS having a dual gate structure is configured for example as shown in FIG. 1.

As shown in FIG. 1, element formation regions 104 and 105 at which the PMOS and NMOS are to be formed are enclosed by an element isolation region 103. A polycrystalline silicon layer 106 is formed on these element formation regions 104 and 105 over the element isolation region 103.

A $p^+$-type impurity is doped in the region of the polycrystalline silicon interconnection layer 106 over the element formation region 104 for forming the PMOS, while an $n^+$-type impurity is doped in the region of the polycrystalline silicon interconnection layer 106 over the element formation region 105 for forming the NMOS. These doped regions are thereby made conductive and form gate electrodes 101 and 102. Note that the gate electrodes 101 and 102 are electrically connected with each other by a metal sillicide layer formed on the polycrystalline silicon interconnection layer 106 in a later step.

In the CMOS illustrated in FIG. 1, the impurities doped in the gate electrodes 101 and 102 tend to diffuse into the region 106a of the polycrystalline silicon layer 106 not doped with impurities.

If impurities diffuse into the region 106a, the impurities doped in the gate electrodes 101 and 102 will be depleted, the density of the impurities at the gate electrodes will fall, the change in the threshold voltage $V_{th}$, and a fall in the current $I_{DS}$ between the drain and source due to depletion of the gate electrodes will be caused.

To prevent a fall in the current $I_{ds}$ between the drain and source, for example, a CMOS having the structure shown in FIG. 2 has been proposed.

In the CMOS shown in FIG. 2, the gate electrode 101 doped with the $p^+$-type impurity and the gate electrode 102 doped with the $n^+$-type impurity are formed over the element formation regions 104 and 105 and extending off over the element isolation region 103.

That is, when forming the gate electrodes 101 and 102 doping impurities, the impurities are doped in the polycrystalline silicon layer 106 so as to extend off by lengths $L_{diff}$ from the element formation regions 104 and 105.

Accordingly, the extended regions 101a and 102a become sources of stored impurities.

Note that the width $2 \times L_{ovlp}$ of the region 106a of the polycrystalline silicon interconnection layer 106 which is not doped with an impurity is a margin of saf ty s t in view of possible mask misalignment at the time of ion implantation of impurities into the polycrystalline silicon interconnection layer 106.

The length $L_{diff}$ is the length required to prevent a drop in the density of impurities in the gate electrodes 101 and 102.

Accordingly, the drop of the density of impurities in the gate electrodes 101 and 102 can be considerably suppressed and a drop of the current $I_{DS}$ between the drain and source can be prevented.

The problem is that, in the CMOS shown in FIG. 2, the distance $L_p$ between the element formation regions 104 and 105 for forming the PMOS and NMOS becomes $2 \times (L_{diff} + L_{ovlp})$.

To make the extended regions suitably function as sources of stored impurities, the certain extent of the length $L_{diff}$ is needed, for example, if $L_g$ is 0.2 μm, $L_{diff}$ must be 0.3 μm.

Thus, it is difficult to shorten the distance $L_p$ between the PMOS and NMOS to further reduce the chip area.

SUMMARY OF THE INVENTION

An object of the present invention is to provide a CMOS device having a dual gate structure suppressing lateral diffusion of the impurities doped in the n-type and p-type gate electrodes, further shortening the distance between the PMOS and NMOS, and enabling further reduction of the chip size.

According to the present invention, there is provided a semiconductor device comprising a first element formation region in which a device of a first conductivity type is formed; a second element formation region separated from the first element formation region by an element isolation region and in which a device of a second conductivity type different from the first conductivity type is formed; a first gate electrode provided on the first element formation region and containing an impurity of the first conductivity type; a second gate electrode provided on the second element formation region facing the first gate electrode and containing an impurity of the second conductivity type; a first impurity storage region containing the first conductivity type impurity, having one end connected to an end of the first gate electrode, and arranged in a direction different from the direction of arrangement of the first and second gate electrodes; and a second impurity storage region containing the second conductivity type impurity, having one end connected to an end of the second gate electrode, having the other end electrically connected to the other end of the first impurity storage region, and arranged in a direction different from the direction of arrangement of the first and second gate electrodes.

Preferably, the first and second impurity storage regions are physically connected to each other by a semiconductor layer.

More preferably, the semiconductor layer is formed by polycrystalline silicon and the first and second gate electrodes and first and second impurity storage regions are formed by selectively implanting impurities to the polycrystalline silicon layer.

Alternatively, more preferably the width of the semiconductor layer physically connecting the first and second impurity storage regions is a value allowing mask misalignment when forming the first and second gate electrodes and first and second impurity storage regions.

Alternatively, preferably the other ends of the first and second impurity storage regions are electrically connected to each other through a conductive layer.

Alternatively, preferably the first and second impurity storage regions are arranged in a direction perpendicular to the direction of arrangement of the first and second gate electrodes.

Alternatively, preferably the first and second gate electrodes and the first and second impurity storage regions are formed in the same conductive semiconductor layer.

Alternatively, preferably a semiconductor device as set forth in claim 1, wherein the element isolation region is buried in a trench formed a boundary between the first and second conductive type of element formation regions in a semiconductor substrate.

Alternatively, preferably the element isolation region isolates first and second element formation regions comprised of semiconductor layers formed on an insulation layer.

More preferably, the element isolation region is buried in a trench formed in the semiconductor layers.

Alternatively, preferably the widths of the first and second impurity storage regions are equal to the gate length of the first and second gate electrodes and the lengths of the first and second impurity storage regions are longer than the gate length.

In the semiconductor device according to the present invention, by providing the first impurity storage region connected to the first gate electrode outside the first element formation region, the difference in impurity density between the first gate electrode and the first impurity storage region is eliminated and the diffusion of the impurity from the first gate electrode is suppressed.

Similarly, by providing the second impurity storage region connected to the second gate electrode outside the second element formation region, the difference in impurity density between the second gate electrode and the second impurity storage region is eliminated and the diffusion of the impurity from the second gate electrode is suppressed.

Further, the first and second impurity storage regions connected to the first and second gate electrodes are arranged in a direction different from the direction of arrangement of the first and second gate electrodes and front ends of the two are connected electrically.

Accordingly, compared with arranging first and second impurity storage regions of the same length along the direction of arrangement of the first and second gate electrodes, it becomes possible to make the first and second element formation regions closer to each other. In the case of a CMOS, the distance between the PMOS and NMOS can be shortened to reduce the size of the semiconductor device.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, a detailed explanation will be given of preferred embodiments of the present invention with reference to the drawings.

First Embodiment

Figure 3:
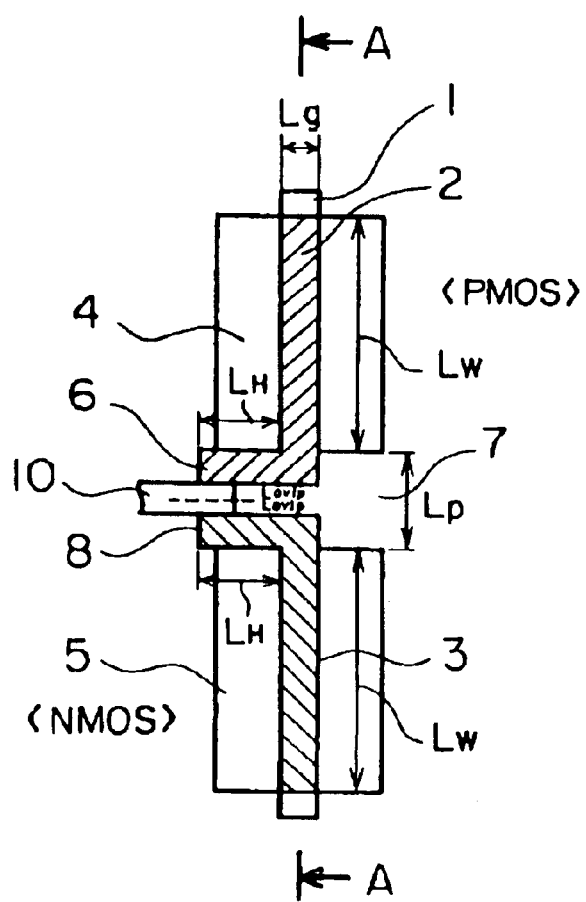
FIG. 3 is a view of an embodiment of the structure of gate electrodes of a semiconductor device according to the present invention.

FIG. 3 is a view of an embodiment of the structure of gate electrodes of a semiconductor device according to the present invention.

As illustrated in FIG. 3, a PMOS formation region 4 for forming a PMOS and an NMOS formation region 5 for forming an NMOS are arranged apart from each other by a distance $L_p$.

On the PMOS formation region 4 is provided a p-type gate electrode 2 having a gate length $L_g$ and a gate width $L_w$ formed by doping a $p^+$-type impurity into a polycrystalline silicon layer 1.

On the NMOS formation region 5 is provided an n-type gate electrode 3 having a gate length $L_g$ and a gate width $L_w$ formed by doping an $n^+$-type impurity into the polycrystalline silicon layer 1. This faces to p-type gate electrode 2 in the direction of arrangement of the p-type gate electrode 2.

Note that while the NMOS and PMOS are shown with the same gate widths $L_w$, generally the dimensions of the two differ.

Further, there is an element isolation region 7 between PMOS formation region 4 and NMOS formation region 5.

Note that, while not illustrated, a tungsten sillicide or other metal sillicide layer is formed by the self-aligned silicate technique on the polycrystalline silicon layer 1 and electrically connects the p-type gate electrode 2 and n-type gate electrode 3.

Outside the PMOS formation region 4, a p-type impurity storage region 6 is formed perpendicular to the direction of the gate width $L_w$ of the p-type gate electrode 2.

The length of p-type impurity storage region 6 is $L_H+L_g$. The width is equal to the gate length $L_g$. One end is connected to the p-type gate electrode 2, while the other end is connected to the polycrystalline silicon interconnection layer 10.

Outside the NMOS formation region 5, an n-type impurity storage region 8 is formed perpendicular to the direction of the gate width $L_w$ of the n-type gate electrode 3.

The length of n-type impurity storage region 8 is $L_H+L_g$. The width is equal to the gate length $L_g$. One end is connected to the n-type gate electrode 3, while the other end is connected to the polycrystalline silicon interconnection layer 10.

The p-type gate electrode 2, the n-type gate electrode 3, the p-type impurity storage region 5, the n-type impurity storage region 8, and the polycrystalline silicon interconnection layer 10 are formed in the same polycrystalline silicon layer 1.

The p-type gate electrode 2 and the p-type impurity storage region 6 are formed by selective ion implantation of a $p^+$-type impurity into a predetermined region of the polycrystalline silicon layer 1.

The $p^+$-type impurity is, for example, boron fluoride ions ($BF_2^+$) and is implanted by a predetermined energy and dosage.

The n-type gate electrode 3 and n-type impurity storage region 8 are formed by selective ion implantation of an $n^+$-type impurity into a predetermined region of the polycrystalline silicon layer 1.

The $n^+$-type impurity is, for example, arsenic tons and is implanted by a predetermined energy and dosage.

The polycrystalline silicon interconnection layer 10 physically connects the front ends of the p-type impurity storage region 6 and the n-type impurity storage region 8.

The distance between the front ends of the p-type impurity storage region 6 and n-type impurity storage region is $2 \times L_{ovlp}$.

The part of the polycrystalline silicon interconnection layer 10 of the distance $2 \times L_{ovlp}$ is the safety margin set in consideration of possible mask misalignment at the time of the selective ion implantation of impurities into the p-type gate electrode 2, the p-type impurity storage region 6, the n-type gate electrode 3, and the n-type impurity storage region 8.

That is, the masks used for the ion implantation into the p-type gate electrode 2 and the p-type impurity storage region 6 and into the n-type gate electrode 3 and n-type impurity storage region 8 are formed up to the broken line shown in FIG. 3 and are formed so as not to overlap at the broken line region.

By implanting $p^+$-type and $n^+$-type impurities into the p-type impurity storage region 6 and the n-type impurity storage region 8, respectively, the p-type impurity storage region 6 and the n-type impurity storage region become kinds of sources of stored impurities.

That is, since impurities are implanted into the p-type impurity storage region 6 and n-type impurity storage region 8 at a similar density to the p-type gate electrode 2 and the n-type electrode 3, the lateral diffusion of impurities from p-type gate electrode 2 and n-type gate electrode 3 into the p-type impurity storage region 6 and n-type impurity storage region 8 is suppressed.

Accordingly, the drop of the densities of impurities in the p-type gate electrode 2 and n-type gate electrode 3 is suppressed, the change of threshold voltage $V_{th}$ and the drop in current $I_{ds}$ between the drain and source due to the depletion of the gates can be prevented.

In the gate structure according this embodiment, the p-type impurity storage region 6 and n-type impurity storage region 8 are formed in a direction perpendicular to the p-type gate electrode 2 and the n-type gate electrode 3. Thus, even if the effective length $L_H$ of the p-type impurity storage region and n-type impurity storage region is changed as appropriate, there is no need to change of the distance between the PMOS formation region 4 and NMOS formation region 5.

Figure 1:
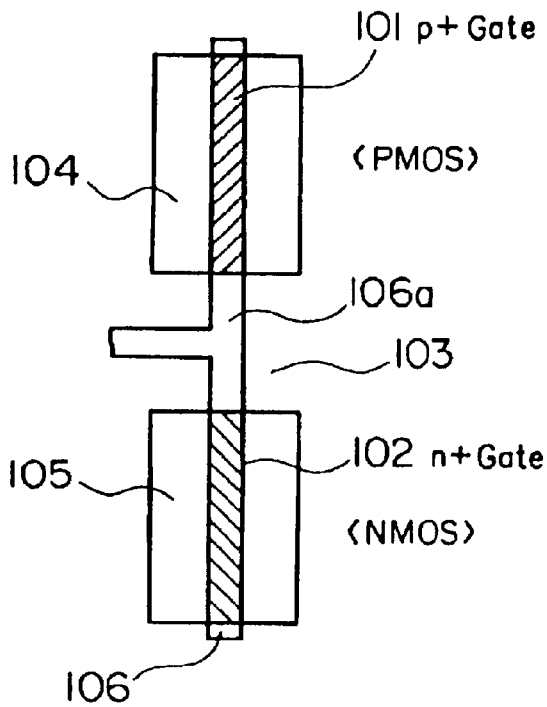
FIG. 1 is a view of an example of the gate electrode structure of a CMOS having a dual gate structure of the related art.
Figure 2:
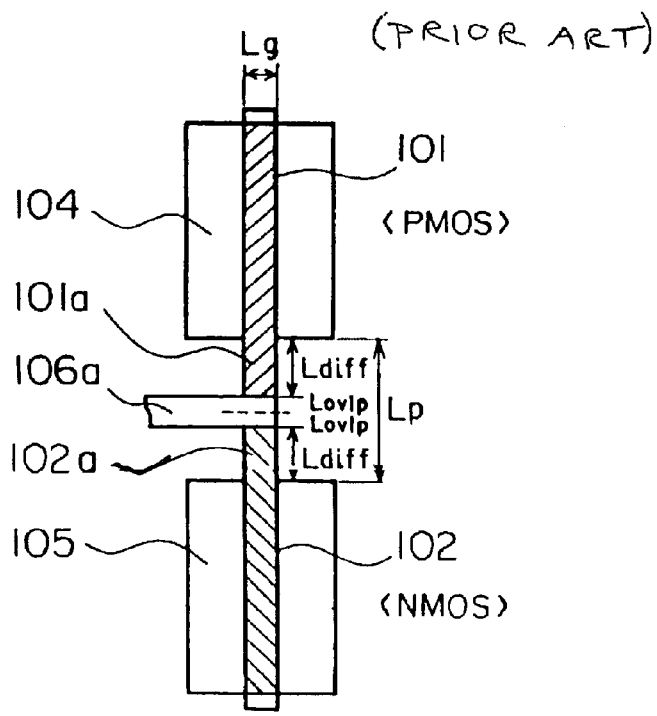
FIG. 2 is a view of another example of the gate electrode structure of a CMOS having a dual gate structure of the related art.

Further, in this embodiment, the effective length $L_H$ of the p-type impurity storage region 6 and n-type impurity storage region 8 is set to at least the length $L_{diff}$ of the regions 110a and 102a illustrated in FIG. 2. For example, the length $L_H$ is so set that the shortest distance from ends of the gate electrodes 2, 3 on the PMOS formation region 4 and the NMOS formation region 5 to the polycrystalline silicon interconnection layer 10 become about the length $L_{diff}$.

Accordingly, the impurity storage region according to this embodiment give a similar performance with the impurity storage region f the gate electrode structure of the related art illustrated in FIG. 2 when the rest of the structure is the same.

The distance between the PMOS formation region 4 and NMOS formation region 5 in this embodiment is shown by the following equation (1):

$$L_p = 2 \times L_g + 2 \times L_{ovlp} \qquad (1)$$

Generally, the gate length $L_g$ is shorter than the length $L_{diff}$ required for the impurity storage region.

Thus, according to this embodiment, the distance $L_p$ between the PMOS formation region 4 and the NMOS formation region 5 can be made shorter than the distance $L_p$ between the PMOS formation region 4 and NMOS formation region 5 of the gate electrode structure of the related art illustrated in FIG. 2.

As an actual example, when $L_g=0.20$ $\mu$m, $L_{ovlp}=0.10$ $\mu$m, and $L_{diff}=0.3$ $\mu$m, $L_p$ becomes 0.8 $\mu$m in the gate electrode structure of the related art but becomes 0.60 $\mu$m in this embodiment or 0.2 $\mu$m shorter.

Therefore, it is possible to reduce the chip area in a semiconductor chip formed with larger numbers of PMOS and NMOS devices.

Note that in this embodiment, the p-type impurity storage region 6 and n-type impurity storage region 8 were arranged outside the PMOS formation region 4 and NMOS formation region 5, but the present invention is not limited to this.

That to, it is possible to arrange the p-type impurity storage region 6 and n-type impurity storage region 8 at positions straddling the PMOS formation region 4 and NMOS formation region 5 and the element isolation region 7 and possible to form them inside the PMOS formation region 4 and NMOS formation region 5.

Further, in this embodiment, the p-type impurity storage region 6 and n-type impurity storage region 8 were arranged in a direction perpendicular to the p-type gate electrode 2 and the n-type gate electrode 3 but the present invention is not limited to this.

That is, it is possible to arrange them not perpendicular to the direction of arrangement of the p-type gate electrode 2 and n-type electrode 3, but at a slant with respect to that direction.

Next, a specific example will be given of the effective range of the gate electrode structure of the above embodiment in relation to the element isolation region 7.

It is possible to shorten the distance $L_p$ between the PMOS formation region 4 and NMOS formation region 5 by using the gate electrode structure according to the above embodiment.

To actually shorten the distance $L_p$, however, the element isolation width $L_{iso}$ of the element isolation region 7 separating the PMOS formation region 4 and NMOS formation region S also has to be capable of being shortened.

Specifically, if the element isolation width $L_{iso}$ satisfies at least the condition shown in the following relation (2), it is possible to shorten the distance $L_p$ between the element formation regions by using the gate electrode structure of the above embodiment:

$$L_{iso} < 2 \times L_{diff} + 2 \times L_{ovlp} \quad (2)$$

Figure 4:
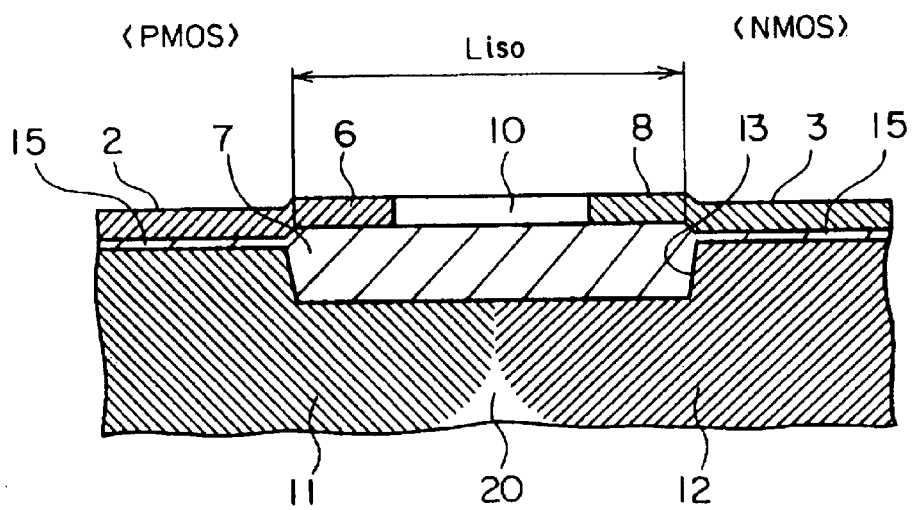
FIG. 4 is a sectional view of a semiconductor device having the gate electrode structure illustrated in FIG. 3 in the A—A line direction and illustrates an example of a semiconductor device having a structure enabling shortening of the width of the element isolation region along with the shortening of the distance $L_p$ between a PMOS information region. 4 and an NMOS formation region 5.

Here, FIG. 4 is a sectional view of a semiconductor device having the gate electrode illustrated in FIG. 3 along the A—A line direction and illustrates an example of a semiconductor device having a structure enabling the width of the element isolation region to be shortened along with the shortening of the distance $L_p$ between the PMOS formation region 4 and NMOS formation region 5.

As illustrated in FIG. 4, a P-well 11 and an N-well 12 are formed in a silicon substrate 20. A trench element isolation region 7 comprised, for example, of silicon oxide is buried in a trench 13 formed in the silicon substrate 20 so as to straddle the P-well 11 and N-well 12.

A p-type gate electrode 2 and n-type gate electrode 3 are formed on the silicon substrate 20 through the insulation film 15, while a p-type impurity storage region 6, n-type impurity storage region 8, and polycrystalline silicon interconnection layer 10 are formed on the element isolation region 7.

$L_{iso}$ in the figure is the element isolation width of the trench element isolation region 7.

Generally, it is known that the element isolation width $L_{iso}$ can be made comparatively smaller since the trench element isolation region is buried in the trench. Note that the method used for formation of the trench element isolation region 7 may be a generally known method, so an explanation of the method will be omitted.

Specifically, under the conditions of $L_g$=0.20 μm, $L_{ovlp}$=0.1 μm, and $L_{diff}$=0.3 μm in the above embodiment, it is possible to make $L_{iso}$ about 0.40 μm.

Thus, since the width $L_p$ between the element formation regions in the case of the gate electrode structure of the related art shown in FIG. 2 is 0.80 μm, $L_{iso}$ is sufficiently shorter than this and it is possible to shorten the distance $L_p$ between the element isolation regions by using the gate electrode structure according to the above embodiment.

Figure 5:
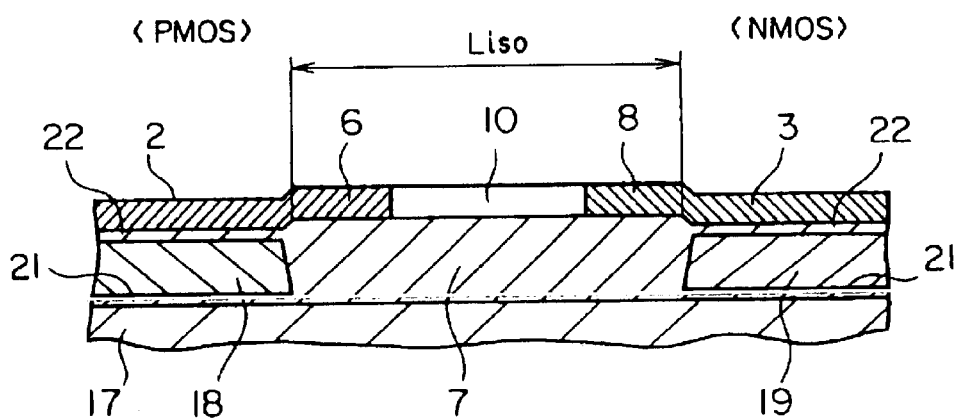
FIG. 5 is a sectional view of the semiconductor device having the gate electrode structure illustrated in FIG. 3 in the A—A line direction illustrating another example of a semiconductor device having a structure enabling shortening of the width of the element isolation region along with the shortening of the distance $L_p$ between a PMOS formation region 4 and an NMOS formation region 5.

FIG. 5 is a sectional view of a semiconductor device having the gate electrode structure illustrated in FIG. 3 in A—A line direction illustrating another example of a semiconductor device of a structure enabling the width of the element isolation region to be shortened along with the shortening of the distance $L_p$ between the PMOS formation region 4 and NMOS formation region 5.

In FIG. 5, an insulation film 21 is formed on the substrate 17, a PMOS substrate (or well) 18 is formed on the side of the insulation film 21 facing the PMOS formation region, and an NMOS substrate (or well) 19 is formed on the side of the insulation film 21 facing the NMOS formation region.

The trench element isolation region is buried between the PMOS substrate (or well) 18 and NMOS substrate (or well) 19.

The p-type gate electrode 2 is formed on the PMOS substrate (or well) 18 through the insulation film 22, the n-type gate electrode 3 is formed on the NMOS substrate (or well) 19 through the insulation film, and the p-type impurity storage region 6, the n-type impurity storage region 8, and the polycrystalline silicon interconnection layer 10 are formed on the trench element isolation region 7.

The semiconductor device shown in FIG. 5 uses a silicon-on-insulator (SOI) structure where the PMOS substrate (or well) 18 and NMOS substrate (or well) 19 are formed on the insulation film 21.

In this structure, the PMOS substrate (or well) 18 and NMOS substrate (or well) 19 are completely insulated electrically by the trench element isolation region 7, so the element isolation performance is extremely high.

Further, the element isolation width $L_{iso}$ in FIG. 5 can be expected to be close to the minimum fabricable dimension in the element isolation structure.

For example, under the conditions of $L_g$=0.20 μm, $L_{ovlp}$=0.10 μm, and $L_{diff}$=0.30 μm in the above embodiment, it is possible to make $L_{iso}$ 0.20 μm or equal to the gate length $L_g$.

Accordingly, by using the gate electrode structure according to the above embodiment for that element isolation structure, it becomes possible to tremendously shorten the distance $L_p$ between the PMOS and NMOS.

Summing up the effects of the invention, it becomes possible to suppress the lateral diffusion of gate impurities and to shorten the distance between the PMOS and NMOS and thereby to reduce the chip area.

While the invention has been described by reference to specific embodiments chosen for purposes of illustration, it should be apparent that numerous modifications could be made thereto by those skilled in the art without departing from the basic concept and scope of the invention.

What is claimed:

1. A semiconductor device comprising:
    a first element formation region in which a device of a first conductivity type is formed;
    a second element formation region separated from said first element formation region by an element isolation region and in which a device of a second conductivity type different from said first conductivity type is formed;
    a first gate electrode provided on said first element formation region and containing an impurity of the first conductivity type;
    a second gate electrode provided on said second element formation region facing said first gate electrode and containing an impurity of the second conductivity type;
    a first impurity storage region containing said first conductivity type impurity, having one end connected to an end of said first gate electrode, and arranged in a direction different from the direction of arrangement of said first and second gate electrodes; and
    a second impurity storage region, physically connected to said first impurity storage region by a semiconductor layer, said second impurity storage region containing said second conductivity type impurity, and having one end connected to an end of said second gate electrode, having the other end electrically connected to the other end of said first impurity storage region, and arranged in a direction different from the direction of arrangement of said first and second gate electrodes,
    the widths of said first and second impurity storage regions are equal to the gate length of said first and second gate electrodes and the lengths of said first and second impurity storage regions are longer than said gate length.

2. A semiconductor device as set forth in claim 1, wherein the other ends of said first and second impurity storage regions are electrically connected to each other through a conductive layer.

3. A semiconductor device as set forth in claim 1, wherein said first and second impurity storage regions are arranged in a direction perpendicular to the direction of arrangement of said first and second gate electrodes.

4. A semiconductor device as set forth in claim 1, wherein said first and second gate electrodes and said first and second impurity storage regions are formed in the same conductive semiconductor layer.

5. A semiconductor device as set forth in claim 1, wherein said element isolation region is buried in a trench formed a boundary between said first and second conductive type of element formation regions in a semiconductor substrate.

6. A semiconductor device as set forth in claim 1, wherein said element isolation region isolates first and second element formation regions comprised of semiconductor layers formed on an insulation layer.

7. A semiconductor device as set forth in claim 6, wherein said element isolation region is buried in a trench formed in said semiconductor layers.

8. A semiconductor device as set forth in claim 1, wherein:

said semiconductor layer is formed by polycrystalline silicon and said first and second gate storage electrodes and first and second impurity storage regions are formed by selectively implanting impurities to said polycrystalline silicon layer.

9. A semiconductor device as set forth in claim 1, wherein the width of said semiconductor layer physically connecting said first and second impurity storage regions is a value allowing mask misalignment when forming said first and second gate electrodes and first and second impurity storage regions.

* * * * *